(12) United States Patent
Ohtorii (10) Patent No.: US 7,622,700 B2
(45) Date of Patent: Nov. 24, 2009

(54) PHOTO-ELECTRIC CONVERSION APPARATUS WITH ALTERNATING PHOTOELECTRIC CONVERSION ELEMENTS

(75) Inventor: Hiizu Ohtorii, Kanagawa (JP)

(73) Assignee: Sony Corporation, Tokyo (JP)

( * ) Notice: Subject to any disclaimer, the term of this patent is extended or adjusted under 35 U.S.C. 154(b) by 138 days.

(21) Appl. No.: 11/569,616

(22) PCT Filed: Mar. 3, 2005

(86) PCT No.: PCT/JP2005/004157

§ 371 (c)(1),
(2), (4) Date: Nov. 27, 2006

(87) PCT Pub. No.: WO2005/117146

PCT Pub. Date: Dec. 8, 2005

(65) Prior Publication Data

US 2007/0215790 A1    Sep. 20, 2007

(30) Foreign Application Priority Data

May 28, 2004    (JP)    ............... 2004-158496

(51) Int. Cl.
G01J 1/42    (2006.01)
H01J 40/14    (2006.01)
H04N 3/14    (2006.01)

(52) U.S. Cl. ............... 250/208.2; 250/214 R; 348/275

(58) Field of Classification Search ............ 250/208.1, 250/208.2, 214.1, 214 R; 348/275
See application file for complete search history.

(56) References Cited

U.S. PATENT DOCUMENTS 4,471,387 A * 9/1984 Nadler ............... 358/497
5,956,087 A * 9/1999 Takayama et al. ........... 348/275
2004/0109075 A1* 6/2004 Tsunai ............... 348/311

FOREIGN PATENT DOCUMENTS

JP    64-050557    2/1989

(Continued)

OTHER PUBLICATIONS

International Search Report dated Jun. 28, 2005.

(Continued)

*Primary Examiner*—Thanh X Luu
(74) *Attorney, Agent, or Firm*—Sonnenschein Nath & Rosenthal LLP (57) ABSTRACT

A photoelectric conversion element array having a plurality of photoelectric conversion elements (emitting optics 4, receiving optics 5) arranged in an array, and the photoelectric conversion elements 4, 5 are arranged alternately at different positions so that every second one is aligned on the same line in the direction of array. A mounted structure of photoelectric conversion element array, having the emitting optics array and the receiving optics array in the photoelectric conversion element array of this invention, arranged on an interposer substrate 9 so as to oppose therewith, and these arrays are mounted on the interposer substrate 9 through the external connection terminals 7. An optical information processing apparatus 1 having the photoelectric conversion element array of the present invention, and an optical wave guide 3 opposed to the respective optics of the photoelectric conversion element arrays. These configurations not only allow high-density integration of optical interconnects, but also reduce optical interference or crosstalk due to the photoelectric conversion element, and can thereby provide a photoelectric conversion element array allowing efficient propagation of light, an integrated apparatus thereof, a mounted structure of them, and an optical information processing apparatus.

2 Claims, 11 Drawing Sheets

FOREIGN PATENT DOCUMENTS

| | | |
|---|---|---|
| JP | 06-000991 | 1/1994 |
| JP | 06-163980 | 6/1994 |
| JP | 2002-022215 | 1/2002 |
| JP | 2002-189137 | 7/2002 |
| JP | 2002-196571 | 7/2002 |
| JP | 2002-280655 | 9/2002 |
| JP | 2003-222746 | 8/2003 |
| JP | 2004-212-847 | 7/2004 |

OTHER PUBLICATIONS

Nikkei Electronics; Encountering the Optical Wiring; Dec. 3, 2001.

* cited by examiner

10 UNIT DISTRIBUTED PROCESSING

PHOTO-ELECTRIC CONVERSION APPARATUS WITH ALTERNATING PHOTOELECTRIC CONVERSION ELEMENTS

TECHNICAL FIELD

This invention relates to a photo-electric conversion element array, an integrated apparatus of the same, mounted structures of them, and an optical information processing apparatus.

BACKGROUND ART

Nowadays, all signal propagations among semiconductor chips such as LSIs (large scale integrated circuits) rely upon electric signals via interconnections on a substrate. However, with recent trends in higher functionalization of MPU, volume of data transmission among the chips has extremely increased, and this has raised various high-frequency-related problems. Representative problems include RC signal delay, impedance mismatching, EMC/EMI, crosstalk and the like.

In order to solve the above-described problems, various techniques such as optimization of interconnect arrangement, development of new materials and so forth have been adopted to the solution, mainly contributed by mounting-related industries.

However in recent years, effects of the above-described optimization of interconnect arrangement and development of new materials have been approaching more closer to the physical limit, so that there has arisen a need of re-examining structure per se of printed wiring board on the premise of simple mounting of semiconductor chips, in view of realizing a more advanced system functionalization. In recent years, various radical measures have been proposed in order to solve these problems. Representative examples thereof will be listed below.

Micro-Interconnect Coupling using Multi-Chip Module (MCM)

Highly functionalized chips are mounted on a precision mounting board composed of ceramic, silicon or the like, to thereby realize micro-interconnect coupling which cannot be formed on a mother board (multi-layered printed board). This configuration can narrow interconnect pitch, wherein widening of bus can drastically increase volume of data to be sent or to be received.

Electric Interconnect Coupling by Encapsulation and Integration of Various Semiconductor Chips Various semiconductor chips are two-dimensionally encapsulated and integrated using polyimide resin or the like, and are coupled by micro-interconnects on thus-integrated board. This configuration can narrow interconnect pitch, wherein widening of bus can drastically increase volume of data to be sent or to be received.

Three-Dimensional Coupling of Semiconductor Chips

The individual semiconductor chips are provided with penetrative electrodes, and bonded to each other to thereby obtain a stacked structure. This configuration can physically shorten connection between different semiconductor chips, and can consequently avoid problems in signal delay and the like. On the other hand, the configuration raises problems in increase in the amount of heat generation and thermal stress between the semiconductor chips, ascribable to the stacking.

In order to realize still higher speed and larger volume of signal sending/receiving and larger volume as described in the above, coupling technologies based on optical transmission have been developed (see, for example, Nikkei Electronics "Encounter with Optical Interconnect", Dec. 3, 2001, p. 122, p. 123, p. 124, p. 125, FIG. 4, FIG. 5, FIG. 6, FIG. 7; and NTT R&D, Vol. 48, No. 3, pp. 271-280 (1999), described later). The optical interconnect is applicable to various sites such as between electronic instruments, between boards inside electronic instruments, between chips on the board, and the like.

Figure 10A:
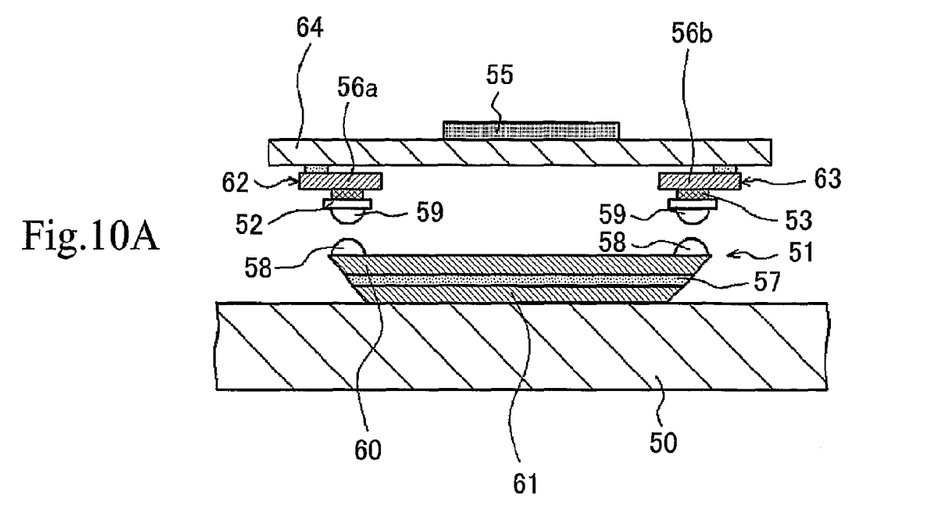
FIG. 10A to FIG. 10C are schematic drawings showing a system using an optical waveguide, according to a conventional example.
Figure 10B:
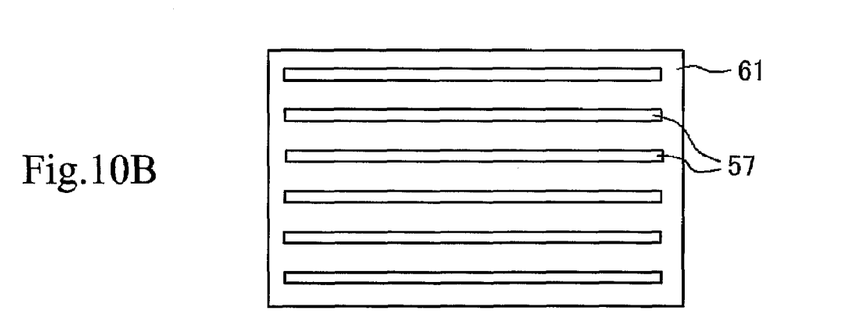
Figure 10C:
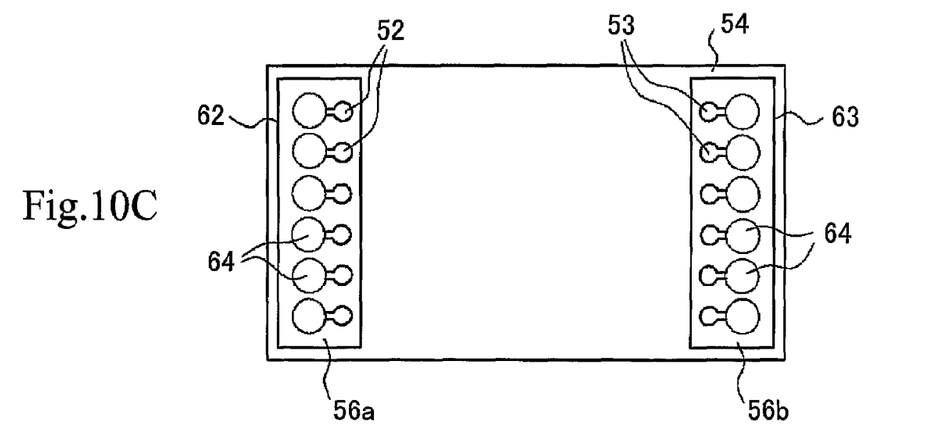

For example, as shown in FIG. 10A to FIG. 10C, on a printed circuit board 50 having an optical waveguide 51 formed thereon, a beam (laser beam, for example) modulated based on signals by emitting optics (surface emission laser, for example) 52 is allowed to enter the optical waveguides 51, the incident light is guided through the optical waveguide 51, emitted from the optical waveguide 51, and received by receiving optics (photodiode, for example) 53. In this way, it is made possible to build up an optical transmission/communication system using the optical waveguide 51 as a transmission path for laser beam or the like modulated based on signals.

The optical waveguide 51 is composed of cladding layers 60 and 61, core layers 57 held therebetween, and has lens components provided on the cladding layer 60 at positions corresponded to the light input/output portions. As shown in FIG. 10B, a plurality of core layers 57 are provided in parallel. FIG. 10B does not illustrate the cladding layer 61.

Each of the emitting optics 52 and the receiving optics 53 are disposed on bases 56a and 56b, respectively, as being corresponded to the input/output portions of the plurality of the core layers 57, to thereby configure an emitting optics array 62 and a receiving optics array 63. Each of the emitting optics 52 and the receiving optics 53 have an optical component 59 provided thereon, thereby allowing efficient emission and input of the light. In addition, the emitting optics array 62 and the receiving optics 53 are mounted on a mounting board (interposer, for example) 54 having a drive circuit element 55 formed thereon.

As shown in FIG. 10C, each of the emitting optics 52 is connected with an external connection terminal 64, and they are arranged in parallel on the base 56a as being corresponded to the individual light input/output portions of the core layers 57, to thereby configure the emitting optics array 62. The same will apply also to the receiving optics array 63.

DISCLOSURE OF THE INVENTION

However, the optical waveguide 51 according to the prior art described in the above suffers from a technical difficulty in further raising the density of array of the core layers 57 (typically to 100-μm pitch or below). Reasons thereof will be described below.

As shown in FIG. 10A, the optical waveguide 51 according to the prior art has the light input/output portion having a 45°-inclined mirror surface which is formed by mechanical processing such as using disk blade saw or the like. This configuration makes the light input/output portions of the plurality of core layers 57 aligned along a line extending normal to the direction of guiding (propagation) of light, as illustrated in the drawing. Although selective formation of the mirror portions typically by isotropic etching has been investigated, it is supposed at present as impossible to adopt the method to mass production, due to insufficient levels of accuracy and stability.

Also the emitting optics 52 and the receiving optics 53 will have a linear arrangement, because they are arranged as being corresponded to the light input/output portions of the core layers 57.

However, the emitting optics 52 and the receiving optics 53 cannot be arranged with a high density, in view of avoiding adverse effects caused by interference of light between the adjacent elements (signal interference on the adjacent path may occur because the light advances with an angle of spreading of as much as 10° or around), and by crosstalk induced by heat generation of the elements (heat generation by light emission may alter characteristics of the adjacent element). For this reason, a certain length of pitch is necessary also for the core layers 57, and this makes it impossible to adopt a high-density-array configuration.

Based on the reasons described in the above, it is difficult to integrate the optical interconnects with a large density, such as having a pitch of 100 μm or smaller, for the light transmission/communication systems according to the prior art, using the optical waveguides 51 as a transmission route for signal-modulated laser beam or the like. This is a cause for limiting the number of light transmission channels only to a level of several tens at maximum.

The present invention was conceived in order to solve the above-described problems, and an object thereof is to provide a photoelectric conversion element array, not only allows high-density integration of optical interconnects, but also reduces optical interference or crosstalk due to the photoelectric conversion element, and can thereby provide a photoelectric conversion element array allowing efficient propagation of light, an integrated apparatus thereof, a mounted structure of them, and an optical information processing apparatus.

More specifically, the present invention relates to a photoelectric conversion element array having a plurality of photoelectric conversion elements arranged in an array, the photoelectric conversion elements being arranged alternately at different positions so that every second one is aligned on the same line in the direction of array.

The present invention relates also to a photoelectric conversion element array integrated apparatus having a plurality of photoelectric conversion elements arranged in an array, wherein a plurality of photoelectric conversion element arrays, each having these photoelectric conversion elements arranged alternately at different positions so that every second one is aligned on the same line in the direction of array, are disposed in parallel, and the adjacent ones of the photoelectric conversion element arrays have the individual photoelectric conversion elements disposed therein at different positions in the direction of array.

The present invention relates also to a mounted structure of photoelectric conversion element array or photoelectric conversion element array integrated apparatus, having the emitting optics array and the receiving optics array in the photoelectric conversion element array or the photoelectric conversion element array integrated apparatus of the present invention, arranged on an interposer substrate so as to oppose therewith, the arrays being mounted on the interposer substrate through the external connection terminals.

The present invention relates still also to an optical information processing apparatus having the photoelectric conversion element array or the photoelectric conversion element array integrated apparatus of the present invention, and optical wave guides opposed to the respective optics of the photoelectric conversion element arrays.

The present inventor has extensively been investigating through the above-described integration with a higher density, and has already proposed, in Japanese Patent Application Publication No. 2002-364841 (occasionally referred to as "the earlier application", hereinafter), an optical waveguide having a plurality of core layers arranged in parallel, wherein positions of the light input/output sections are shifted from those of every adjacent core layer in the direction of guiding of light, and have first found out that this sort of structure can be realized by a synchrotron radiation lithographic process. This process makes it possible to arrange also the photoelectric conversion elements (emitting optics and receiving optics), arranged as being corresponded with the light input/output portions of the core layers, as being shifted in the direction of guidance of wave. As a consequence, the distance between the adjacent emitting optics (or receiving optics) can be widened as compared with the above-described conventional example, even under a high integration density, so that adverse influences, such as light interference between the adjacent photoelectric conversion elements, crosstalk due to heat generation by the elements and so forth, can be reduced as compared with the structure according to the prior art.

However, the present inventor went through extensive investigations aiming at realizing further improvement in the characteristics, and found out that even the configuration according to the earlier application may cause optical interference, crosstalk or the like, due to lack of distance between the adjacent emitting optics (or receiving optics).

In contrast, the photoelectric conversion element array of the present invention is composed of a plurality of photoelectric conversion elements (emitting optics or receiving optics) arranged in an array, wherein the photoelectric conversion elements are arranged alternately at different positions so that every second one is aligned on the same line in the direction of array, so that a sufficient level of distance can be ensured between every adjacent photoelectric conversion elements even if the integration density is increased. Difficulty in the mounting can therefore be moderated, and optical and electrical interferences and crosstalk are effectively be avoidable, allowing further pursuit of larger transmission capacity and lower cost of the system.

BEST MODES FOR CARRYING OUT THE INVENTION

In the present invention, it is preferable that each of the plurality of photoelectric conversion elements is respectively connected with the external connection terminal, and that the pairs of the photoelectric conversion element and the external connection terminal are inverted in the direction of the array. It is also preferable that adjacent pairs are alternately shifted in the direction normal to the direction of array. This configuration allows increase in the distance between the adjacent photoelectric conversion elements and the external connection terminals, improves the integration density of the photoelectric conversion elements without causing optical interference and crosstalk, makes it easier to arrange the adjacent external connection terminals, and can thereby increase the integration density of the optical waveguide, described later, in a simple and exact manner.

Moreover, the photoelectric conversion element array of the present invention is preferably configured as an emitting optics array or a receiving optics array, and the emitting optics array or the receiving optics array are preferably mounted via the external connection terminals to the interposer substrate having the drive circuit element disposed thereon.

Paragraphs below will explain preferable embodiments of the present invention referring to the attached drawings.

First Embodiment

Figure 1A:
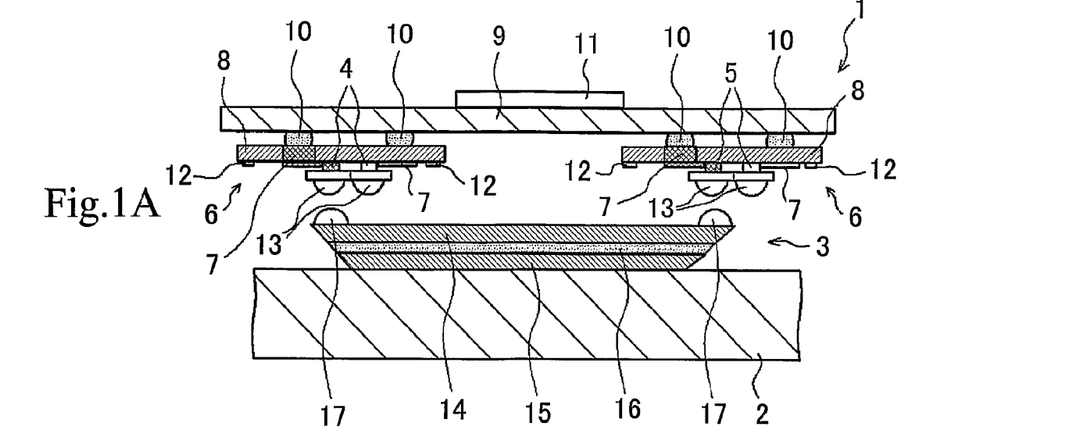
FIG. 1A to FIG. 1C are schematic drawings of an optical information processing apparatus and a photoelectric conversion element array (or photoelectric conversion element array integrated apparatus) based on the present invention, according to a first embodiment of the present invention.
Figure 1B:
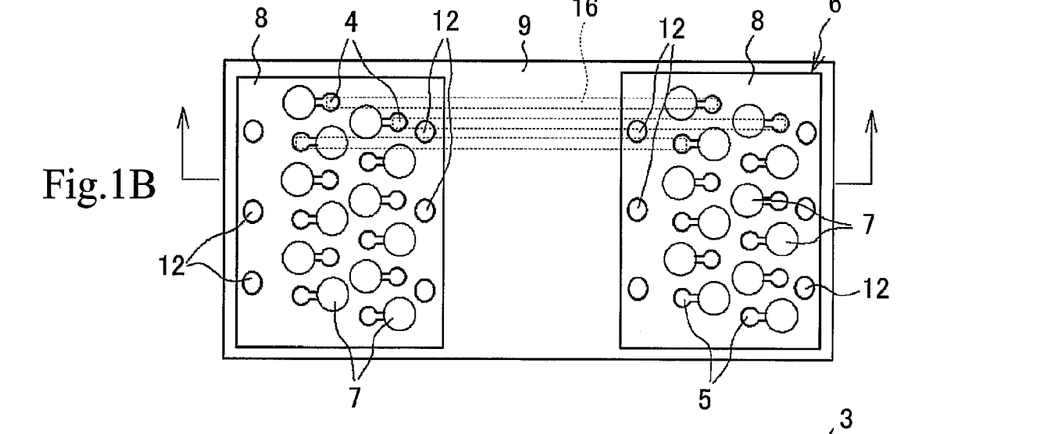
Figure 1C:
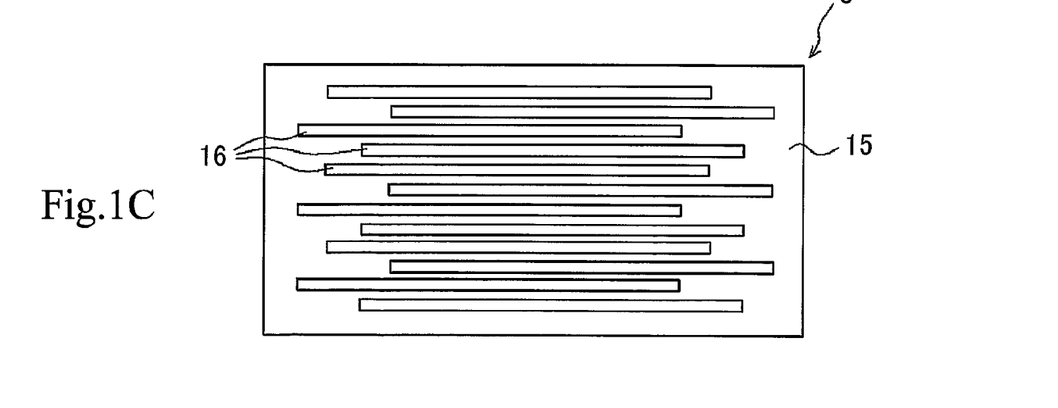

FIG. 1A to FIG. 1C are schematic drawings showing a photoelectric conversion element array integrated apparatus and an optical information processing apparatus based on the present invention. As shown in FIG. 1A, an optical information processing apparatus 1 based on the present invention has an optical waveguide 3 formed on a printed wiring board 2, in which light modulated by signals by the emitting optics (surface emission laser, for example) 4 as the photoelectric conversion element is introduced into the optical waveguide 3, guided through the optical waveguide 3, emitted from the optical waveguide 3, and received by the receiving optics (photodiode, for example) 5 as the photoelectric conversion element. In this way, an optical transmission/communication system using the optical waveguide 3 as a transmission path of signal-modulated laser light and so forth can be configured.

As shown in FIG. 1A and FIG. 1B, a photoelectric conversion element array integrated apparatus 6 based on the present invention has a plurality of emitting optics 4 (or receiving optics 5) arranged in an array, wherein a plurality of photoelectric conversion element arrays, each having these photoelectric conversion elements 4 (or 5) arranged alternately at different positions so that every second one is aligned on the same line in the direction of array, are disposed in parallel on a base 8, and the adjacent ones of the photoelectric conversion element arrays have the individual photoelectric conversion elements 4 (or 5) disposed therein at different positions in the direction of array.

It is preferable herein that an external connection terminal 7 (anode electrode) is connected to each of the plurality of photoelectric conversion elements 4 (or 5), and pairs of the photoelectric conversion elements 4 (or 5) and the external connection terminals 7 are formed in an inverted pattern in the direction of array. In addition, it is also preferable that the adjacent ones of the pairs are arranged as being alternately shifted in the direction normal to the direction of array. This configuration allows increase in the distance between the adjacent photoelectric conversion elements 4 (or 5), improves the integration density of the photoelectric conversion elements 4 (or 5) without causing optical interference and crosstalk, and can thereby increase the integration density of the optical waveguide, described later, in a simple and exact manner. There are also formed ground electrodes (cathode electrodes) 12 corresponding to the photoelectric conversion elements 4 (or 5).

As described in the above, photoelectric conversion element array based on the present invention is configured as an emitting optics array or a receiving optics array.

The emitting optics array and the receiving optics array are disposed as being opposed with each other on an interposer substrate 9, wherein these arrays are mounted on the interposer substrate 9 while placing the external connection terminals 7 and solder bumps 10 in between. On the interposer substrate 9, there are provided also interconnects (not shown) connected to the photoelectric conversion elements 4 (or 5) and a drive circuit element 11.

It is also preferable that lens components 13 are disposed corresponding to the emitting optics 4 and receiving optics 5. This configuration allows more efficient introduction and extraction of light. It is to be noted that the lens components 13 are not shown in FIG. 1B.

As shown in FIG. 1A and FIG. 1C, the optical waveguide 3 is composed of cladding layers 14 and 15, and core layers 16 held therebetween, wherein lens components 17 are provided at positions corresponded to the light input/output portions on the cladding layer 14. The plurality of core layers 16 are arranged in parallel to each other, each having an input portion and an output portion formed as a 45° mirror surface. The input portions and the output portions of every adjacent core layers are formed as being shifted in the direction of guiding (propagation) of light, corresponding to the emitting optics 4 and the receiving optics 5. The cladding layer 14 is not shown in FIG. 1C. The optical waveguide thus configured can be fabricated typically by using a synchrotron radiation lithographic process.

In the mechanism of optical information processing apparatus 1 based on the present invention, light (laser beam, for example) modulated by signals by the emitting optics 4 is collimated by the lens components 13. The signal light is further condensed by the lens components 17 formed on the light input portions of the optical waveguide 3, and effectively input to the core layers 16 of the optical waveguide 3. The input light is guided through the optical waveguide 3, collimated by the lens components 17 formed on the output portions of the optical waveguide 3, and emitted from the optical waveguide 3. The emitted light is condensed by the lens components 13, and effectively received by the receiving optics 5. In this way, in is made possible to build up an optical transmission/communication system using the optical waveguide 3 as a transmission path for signal-modulated laser beam or the like.

According to this embodiment, the photoelectric conversion element array based on the present invention is composed of a plurality of photoelectric conversion elements 4, 5 arranged in an array, and the photoelectric conversion elements 4, 5 are arranged alternately at different positions so that every second one is aligned on the same line in the direction of array, so that a sufficient level of distance can be ensured between every adjacent photoelectric conversion elements 4, 5 even if the integration density of the core layers 16 is increased. Difficulty in the mounting can therefore be moderated, and optical and electrical interferences and crosstalk of the photoelectric conversion elements 4, 5 is effectively avoidable, allowing further pursuit of larger transmission capacity and lower cost of the system.

Because the occupied area of the lens components 13 can be increased, coupling efficiency can be improved, and consequently it is made possible to typically improve the system reliability, and to suppress the power consumption.

Moreover, the distance between the adjacent external connection terminals 7 (and the adjacent solder bumps 10) can be increased, and thereby the reliability and mass producibility are improved.

Figure 2A:
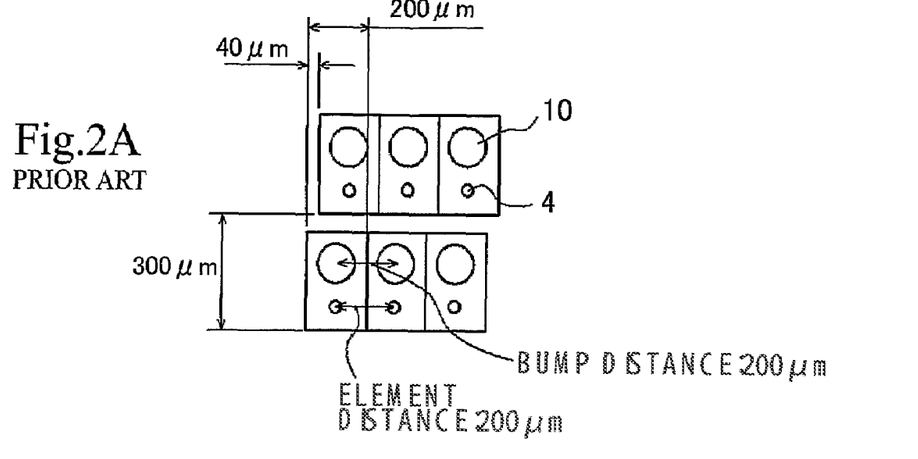
FIG. 2A and FIG. 2B are schematic drawings comparatively showing exemplary arrangement according to a photoelectric conversion element array integrated apparatus, based on the present invention.
Figure 2B:
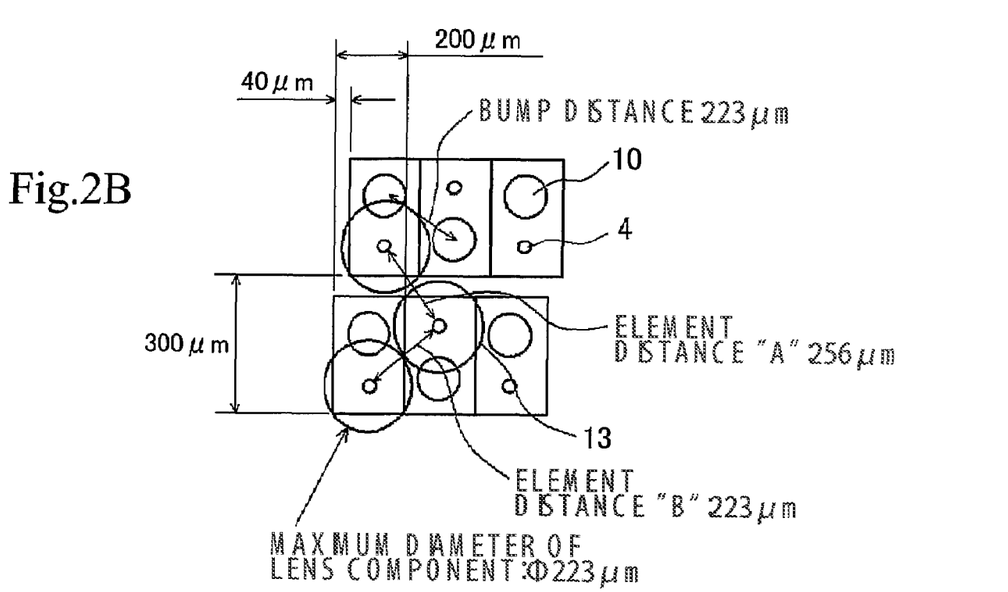

FIG. 2A is a schematic drawing showing an exemplary arrangement according to the earlier application, and FIG. 2B is a schematic drawing of an exemplary arrangement according to the present invention.

It is generally believed that high frequency characteristics of the adjacent elements 4, 5 degrades due to heat conduction from one element to another, and that a distance of approximately 100 µm between the adjacent elements can avoid the problem. The exemplary arrangement in the earlier application, shown in FIG. 2A, can ensure a distance between the every adjacent elements of 200 µm. In contrast to this, the exemplary arrangement in this embodiment, shown in FIG. 2B, can ensure an element distance "A" of 256 µm between the photoelectric conversion element arrays, and can ensure an element distance "B" of 223 µm in the same photoelectric conversion element array, which are larger than in the exemplary arrangement in the earlier application.

Downsizing of the solder bumps 10 has been advancing, wherein the size is preferably 50 µm or larger in diameter, considering the reliability and mass producibility. Pitch of the bumps is preferably twice as large as 100 µm or above. The pitch smaller than this value may result in fusion of the adjacent solder bumps 10 under melting, and may cause short-circuit failure. In the exemplary arrangement in the earlier application shown in FIG. 2A, the distance between the adjacent solder bumps can be ensured as large as 200 µm. In contrast to this, the exemplary arrangement in this embodiment, shown in FIG. 2B, can ensure the distance between the solder bumps 10 as large as 223 µm, which is larger than in the exemplary arrangement in the earlier application.

Moreover, the diameter of the lens components 13 disposed corresponding to the elements 4, 5 is not larger than the distance between the adjacent elements. Flux of light passing through the lens components 13 will have a value obtained by subtracting an allowable error of mounting, taking misalignment caused by mounting into consideration (this is because light signal tends to leak through the neighboring signal line). It is, however, necessary for the flux of light to have a large as possible energy in view of improving the coupling efficiency between the lens components 13. Although not shown in FIG. 2A, the lens components in the exemplary arrangement in the earlier application can be formed as having a maximum diameter of 200 µm. In contrast to this, in the arrangement of this embodiment, the maximum diameter of the lens components 13 can be set to 223 µm as shown in FIG. 2B, larger than in the exemplary arrangement of the earlier application.

The distance between the plurality of photoelectric conversion elements 4, 5 and the solder bumps 10 individually connected to the plurality of photoelectric conversion elements 4, 5 is generally set, for example, to 100 µm or around.

As is obvious from the above, according to this embodiment, photoelectric conversion element array based on the present invention is composed of a plurality of photoelectric conversion elements 4, 5 arranged in an array, and the photoelectric conversion elements 4, 5 are arranged alternately at different positions so that every second one is aligned on the same line in the direction of array, so that a sufficient level of distance can be ensured between the adjacent photoelectric conversion elements 4, 5 and the adjacent external connection terminals 7, even if the integration density of the core layers 16 is increased. Difficulty in the mounting can therefore be moderated, and optical and electrical interferences and crosstalk are effectively be avoidable, allowing further pursuit of larger transmission capacity and lower cost of the system.

Because the occupied area of the lens components 13 can be increased, coupling efficiency can be improved, and consequently it is made possible to typically improve the system reliability, and to suppress the power consumption.

Moreover, the distance between the adjacent external connection terminals 7 (and the adjacent solder bumps 10) can be increased, and thereby the reliability and mass producibility are improved.

Second Embodiment

Figure 3:
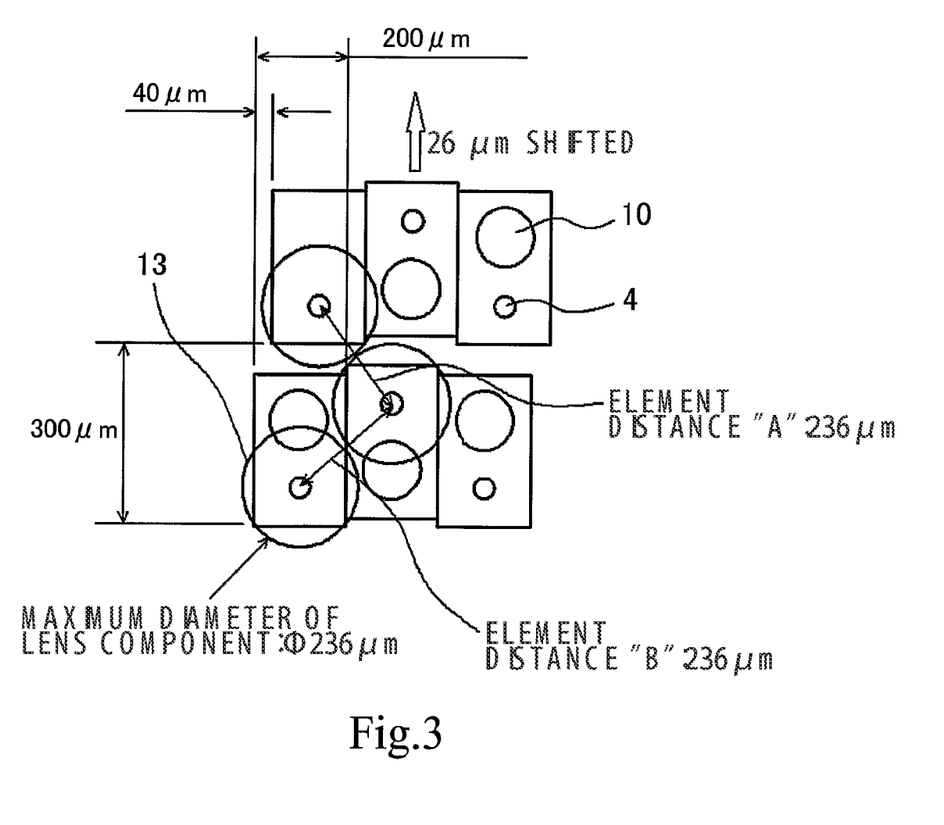
FIG. 3 is a schematic drawing showing another exemplary arrangement based on the present invention, according to a second embodiment of the present invention.

In order to further increase the distance between the adjacent photoelectric conversion elements 4, 5, it is also allowable in the photoelectric conversion element array based on the present invention, as shown in, to shift every second photoelectric conversion element aligned in the direction of array, towards the direction of guiding of light (as much as 26 µm, for example). By this configuration, the element distance "A" between the photoelectric conversion element array (and distance between the adjacent solder bumps 10) can be set to 236 µm, and the element distance "B" in the same photoelectric conversion element array can be set to 236 µm, still larger than in the exemplary arrangement of the first embodiment shown in FIG. 2B. Moreover, the maximum lens component 13 can be ensured to as much as 236 µm, making it still larger than in the exemplary arrangement according to the first embodiment as shown in FIG. 2B. In this way, the coupling efficiency of light can further be improved.

Third Embodiment

As described in the above, the optical information processing apparatus based on the present invention has the photoelectric conversion element arrays and the optical waveguide opposing to the photoelectric conversion element arrays, and is preferably applicable, for example, to a structure having a socket and an optical waveguide disposed in the socket, although the structure thereof is appropriately selectable without departing from the spirit of the present invention.

Figure 4A:
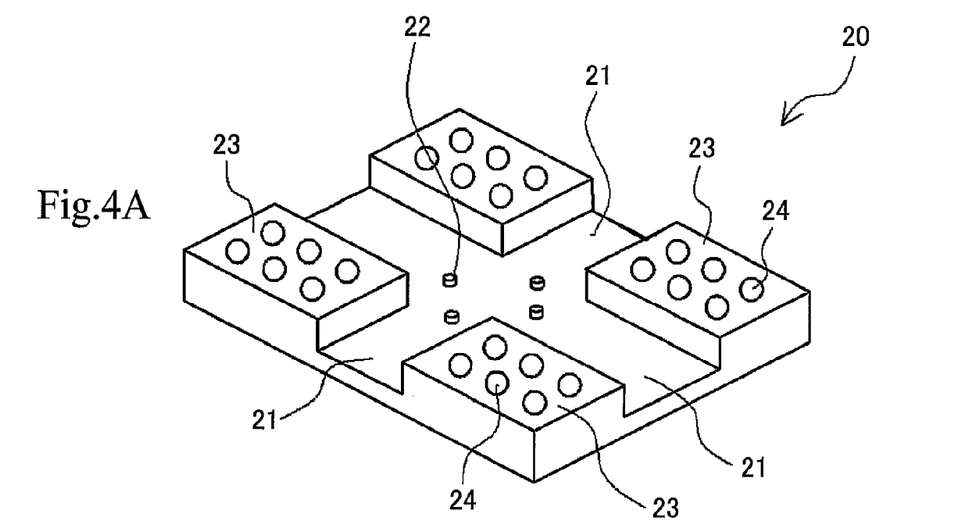
FIG. 4A and FIG. 4B are schematic perspective views showing a socket according to a third embodiment of the present invention.
Figure 4B:
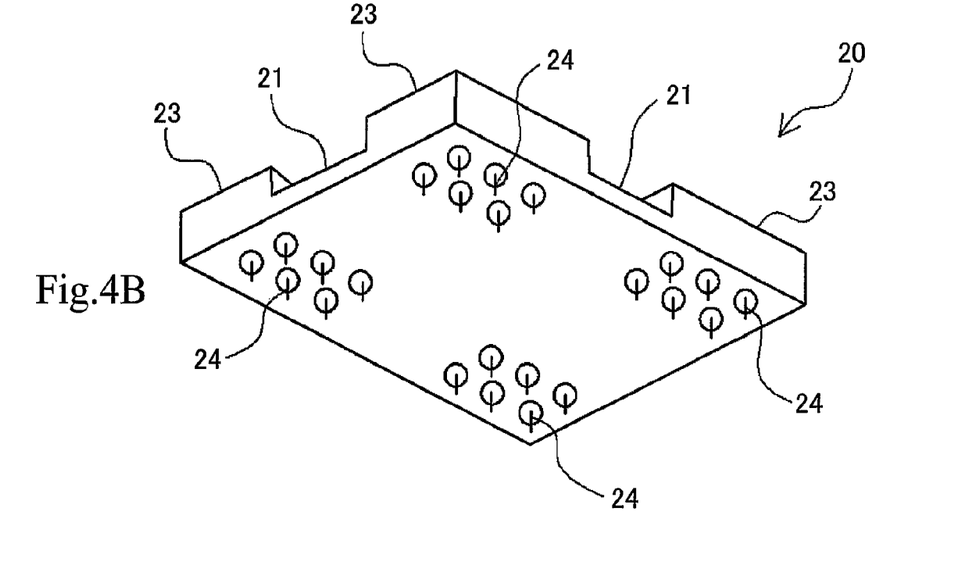

FIG. 4A and FIG. 4B are schematic perspective views of the socket. FIG. 4A is a schematic perspective view as viewed from the side of the surface on which the optical waveguide of the socket is disposed, and FIG. 4B is a schematic sectional view as viewed from the side of the surface opposite to that shown in FIG. 4A.

As shown in FIG. 4A and FIG. 4B, a socket 20 has a positioning means composed of an irregularity structure for positioning and fixing the optical waveguide formed therein. More specifically, the irregularity structure has recesses 21 positioning the width-wise direction of the optical waveguide by allowing it to be engaged therein, and projections 22 positioning the longitudinal direction of the optical waveguide. The depth of the recesses 21 is larger than the thickness of the optical waveguide.

On the projection surfaces 23 of the irregularity structure of the socket 20, there is provided a conduction means allowing conduction between the top surface and the back surface of the irregularity structure, such as terminal pins 24. On the projection surface 23 of the irregularity structure, the photoelectric conversion element array or the photoelectric conversion element array integrated apparatus based on the present invention is fixed, as described later.

A material composing the socket 20 may be any of publicly known materials so far as it is an insulating resin, and may be exemplified by glass-composite PES (polyethylene sulfide) resin, glass-composite PET (polyethylene terephthalate) resin and so forth. As for the materials for the socket 20, there are abundant data already available on the species, insulating properties, reliability and so forth, and there are a wide variety of manufacturers handling them. The structure is, therefore readily acceptable in all aspects of functions, cost, reliability and so forth, and is ready to be harmonized with known processes for mounting on printed wiring board.

Methods of manufacturing the socket 20 are not specifically limited, allowing a simple manufacturing by molding, using a die having the irregularity structure.

Figure 5A:
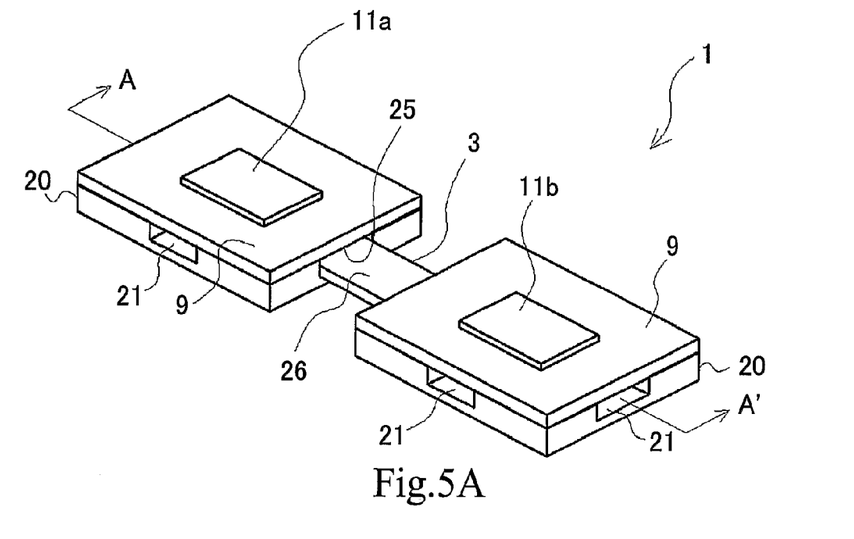
FIG. 5A and FIG. 5B are schematic perspective views showing an optical information processing apparatus using the socket, according to the same.
Figure 5B:
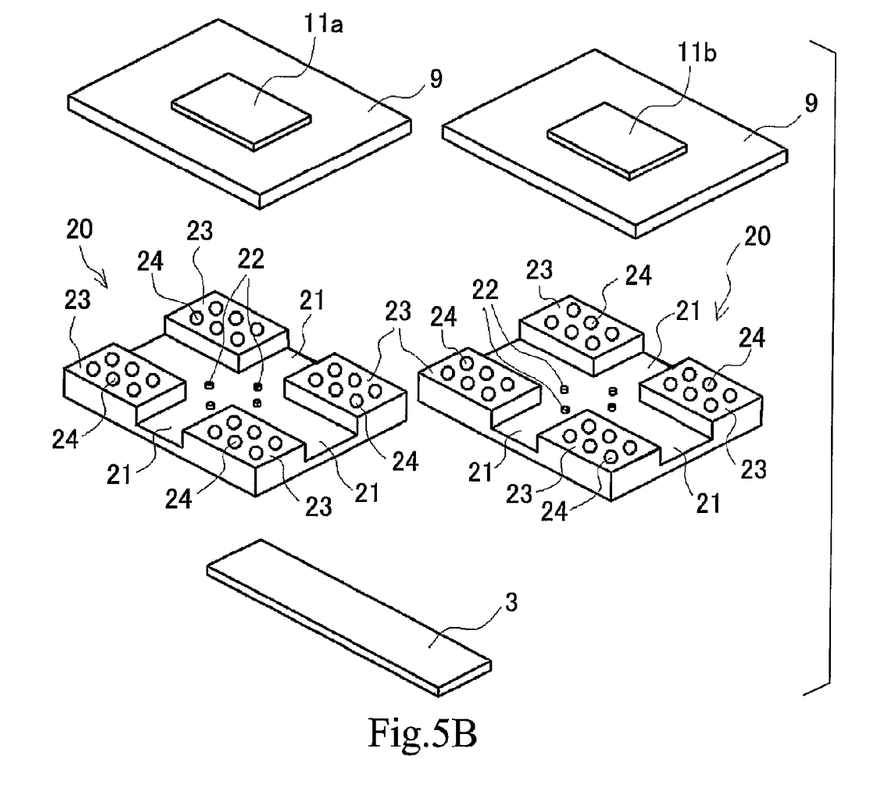

FIG. 5A and FIG. 5B are schematic perspective views of the optical information processing apparatus 1 using the socket 20 based on the present invention.

As shown in FIG. 5A and FIG. 5B, optical information processing apparatus 1 using the socket 20 based on the present invention has a pair of sockets 20, and an optical waveguide 3 provided to the sockets 20, wherein the optical waveguide 3 is bridged between the pair of sockets 20. The optical waveguide 3 has a plurality of core layers arranged therein in parallel, although not shown. The optical waveguide 3 herein does not contact with the printed wiring board described later, so that the optical waveguide 3 is effectively prevented from being destroyed by heat generated in use.

On the projection surfaces 23 of the irregularity structures of each socket 20, the interposer substrate 9 having thereon the photoelectric conversion element array (or the photoelectric conversion element array integrated apparatus) based on the present invention is fixed. The photoelectric conversion element array (or photoelectric conversion element array integrated apparatus) 6 based on the present invention is formed on one surface side of the interposer substrate 9, and drive circuit elements 11a, 11b are mounted on the other surface side.

Figure 6A:
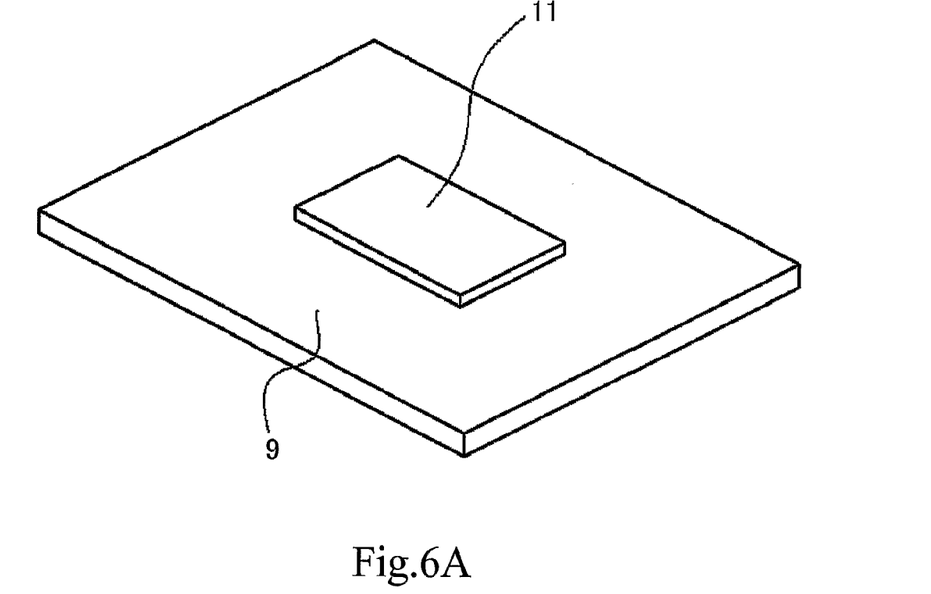
FIG. 6A and FIG. 6B are schematic perspective views showing an interposer substrate, according to the same.
Figure 6B:
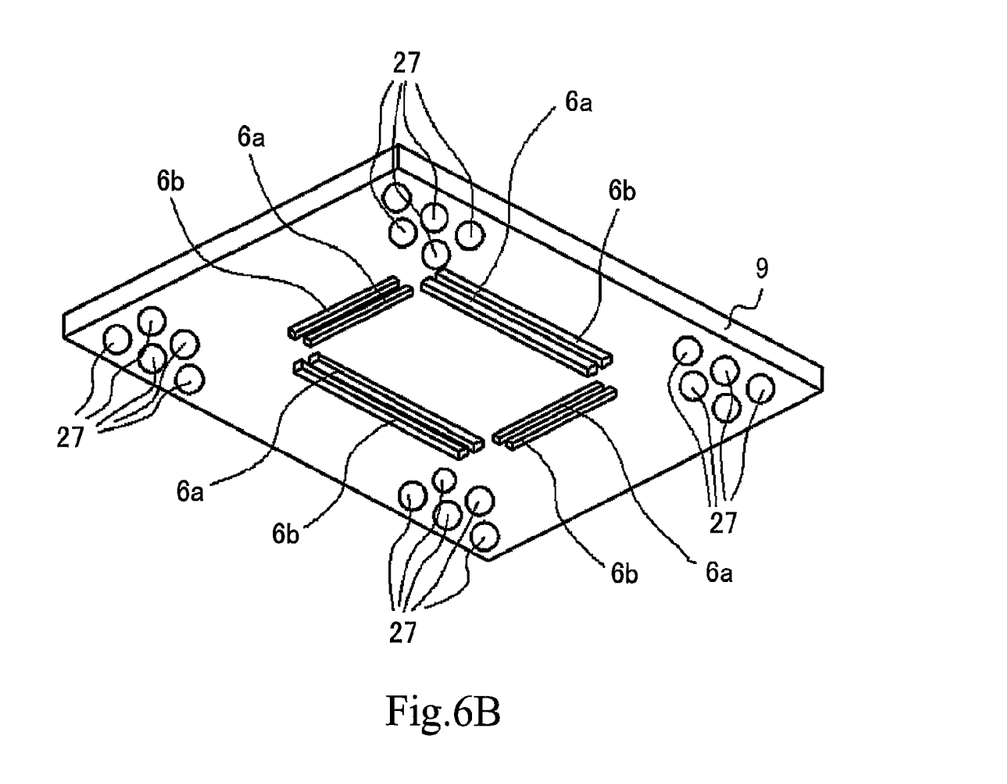

The interposer substrate 9 has, as shown in FIG. 6A and FIG. 6B, the drive circuit elements 11a, 11b mounted on one surface side thereof, and has an emitting optics array 6a and a receiving optics array 6b, as the photoelectric conversion element array based on the present invention (or in the photoelectric conversion element array integrated apparatus) mounted on the other surface side. On the peripheral portions of the interposer substrate 9, other signal wiring electrodes 27 are provided.

When the pair of sockets 20 having the optical waveguide 3 disposed in the recesses 21 thereof and the interposer substrate 9 are fixed together, the interposer substrate 9 is configured so that the side of the surface thereof having the photoelectric conversion element arrays 6a, 6b mounted thereon is brought into contact with the projection surfaces 23 of the sockets 20, and the fixation is accomplished so as to electrically connect the terminal pins 24 of the sockets 20 and the other signal wiring electrodes (not shown) on the interposer substrate 9.

By making the depth (2 mm, for example) of the recesses 21 of the sockets 20 larger than the thickness (1 mm, for example) of the optical waveguide 3, as shown in FIG. 5A and FIG. 5B, a gap 25 can be formed between one surface 26 side of the optical waveguide 3 and the interposer substrate 9.

As described in the above, by mounting the drive circuit elements 11a, 11b on the sockets 20 as being mediated by the interposer substrates 9, an by forming the gap 25 between one surface 26 side of the optical waveguide 3 and the interposer substrate 9, the optical waveguide 3 is effectively prevented from being destroyed by heat generated by the drive circuit elements 11a, 11b during use of the optical information processing apparatus 1.

The operation mechanism is such that an electric signal delivered from one drive circuit element 11a is converted into a light signal, and emitted as a light signal in a form of laser beam from the emitting optics. The emitted light signal enters a correspondent light input portion of one core layer of the optical waveguide 3, guided in the longitudinal direction of the optical waveguide, and emitted from the output portion on the other end of the core layer. The light signal emitted from the optical waveguide is then received by the correspondent receiving optics and converted into an electric signal, and transmitted in a form of electric signal to the other drive circuit element 11b.

The optical information processing apparatus 1 of this embodiment can configure an optical interconnection system using the optical waveguide 3 as an optical interconnect. In other words, the optical information processing apparatus 1 is fixed as being electrically connected to the printed wiring board.

According to this embodiment, the photoelectric conversion element array based on the present invention is composed of a plurality of photoelectric conversion elements arranged in an array, and the photoelectric conversion elements are arranged alternately at different positions so that every second one is aligned on the same line in the direction of array, so that a sufficient level of distance can be ensured between every adjacent photoelectric conversion elements even if the integration density of the core layers is increased. Difficulty in the mounting can therefore be moderated, and optical and electrical interferences and crosstalk of the photoelectric conversion elements are effectively avoidable, allowing further pursuit of larger transmission capacity and lower cost of the system.

Because the occupied area of the lens components can be increased, coupling efficiency can be improved, and consequently it is made possible to typically improve the system reliability, and to suppress the power consumption.

Moreover, the distance between the adjacent external connection terminals (and the adjacent solder bumps) can be increased, and thereby the reliability and mass producibility are improved.

Signal lines between the drive circuit elements 11a, 11b and the photoelectric conversion elements can be made short and equal in length. Therefore, countermeasures for noise in the electric signal and for crosstalk are simplified, and optical modulation speed can be improved.

The optical waveguide 3 can electrically be connected to the printed wiring board 2 as being placed in the recesses 21 of the sockets 20, so that currently available mounting structure on the printed wiring board 2 is directly applicable without modification. Any other general electric interconnects can be formed according to the conventional processes, if only an area allowing therein placement of the sockets 20 is provided on the printed wiring board 2.

The optical waveguide 3 can be placed in the recesses of the sockets 20, after the sockets 20 are fixed on the printed wiring board 2, and after completion of all mounting processes including high temperature processes such as solder re-flow, molding with an underfill resin and so forth, so that the optical waveguide 3 can be mounted without being damaged by high temperature, even if the optical waveguide 3 is susceptible to high-temperature processes.

The sockets 20 can be fabricated using a resin larger in rigidity than the printed wiring board 2, and the emitting optics or receiving optics and the optical waveguide 3 can optically be coupled on the socket 20, so that a level of accuracy required for the optical coupling can readily be ensured. For example, the currently available molding technique is enough to ensure an assembly accuracy of a several-micrometer level. It is therefore made possible to raise the density of an optical bus.

The electric interconnect structure according to the conventional example had the optical waveguide provided directly on the printed circuit board, so that the waveguide has inhibited the degree of freedom in designing, when the number of pins and interconnects drawn out from the drive circuit elements 11a, 11b increased as a result of more advanced functionalization. This has made difficult to highly functionalize the printed wiring board, consequently resulting in that the situation relies upon SOC (system on chip) having all necessary functions incorporated therein. In contrast to this, the optical information processing apparatus 1 based on the present invention allows the optical waveguide 3 to be electrically connected to the printed wiring board 2, as being provided to the recesses 21 of the sockets 20, so that it is made possible to develop an optical interconnect system on the printed wiring board at a low cost and with a large degree of freedom, while keeping a high density interconnects on the printed wiring board 2 and the degree of freedom in the design thereof unchanged, in prospects of high-speed decentralized processing on the printed wiring board, higher functionalization of electronic instruments on the total basis, and decrease in TAT (turn around time) of development.

Next paragraphs will explain an exemplary method of fabricating the optical information processing apparatus 1 based on the present invention, referring to FIG. 7A to FIG. 7E, to FIG. 9A and FIG. 9B.

Figure 7A:
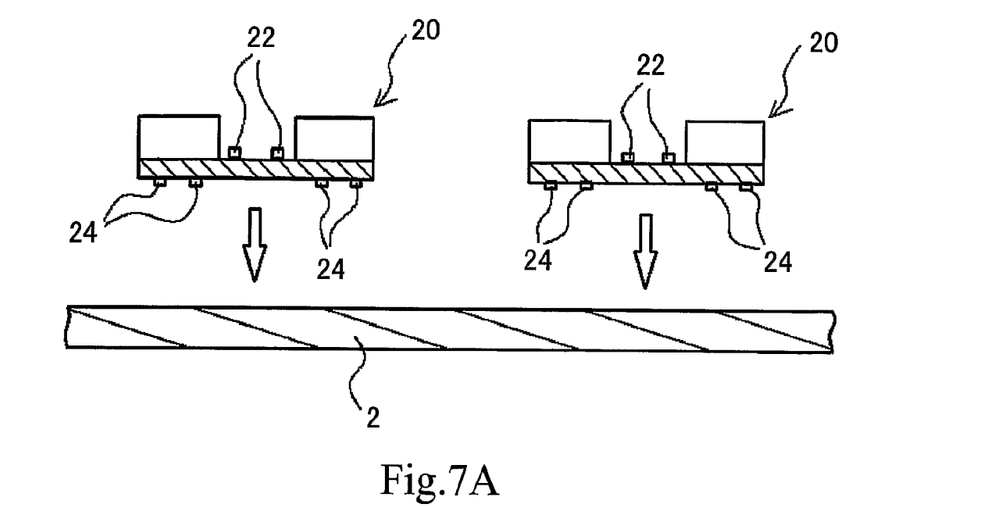
FIG. 7A to FIG. 7E are schematic sectional views sequentially showing process steps of an exemplary method of fabricating the optical information processing apparatus using the socket based on the present invention.
Figure 7B:
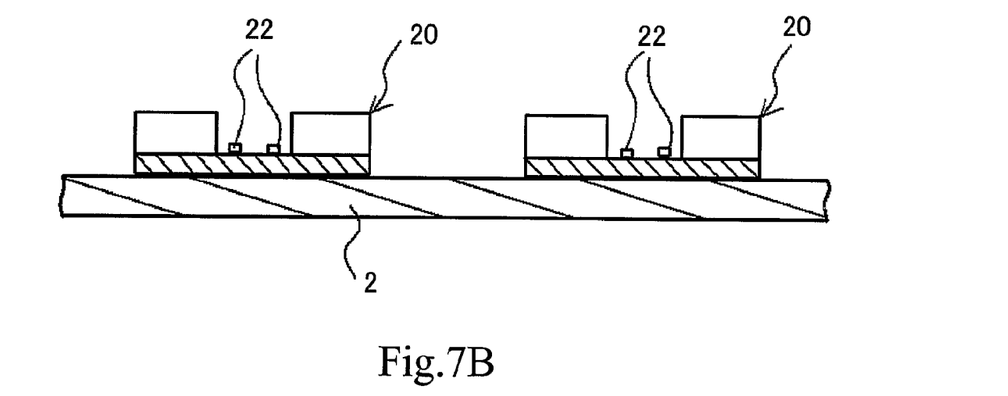

First, as shown in FIG. 7A and FIG. 7B, a pair of sockets 20 are mounted on the printed wiring board 2. In this process, the sockets 20 are mounted so as to align the terminal pins 24 thereof with electrodes (not shown) of the printed wiring board 2, and so that the electrodes and the sockets 20 are electrically connected.

Although not shown in the drawings, the printed wiring board 2 has other electronic components and electric interconnects preliminarily mounted or formed thereon.

Figure 7C:
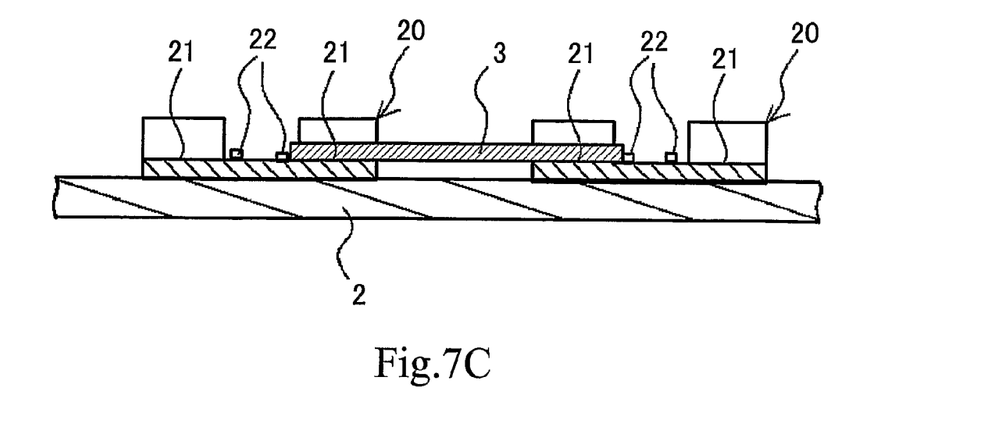

Next, as shown in FIG. 7C, the optical waveguide 3 is placed in the recesses 21 of the sockets 20, so as to bridge the pair of sockets 20. In this process, the projections 22 provided as the irregularity structure to the sockets 20 facilitate positioning of the optical waveguide 3 in the longitudinal direction, and the recesses 21 facilitate positioning of the optical waveguide 3 in the width-wise direction. Because the optical waveguide 3 is disposed in the recesses 21 of the sockets 20, the optical waveguide 3 and the printed wiring board 2 are kept non-contact.

Figure 8A:
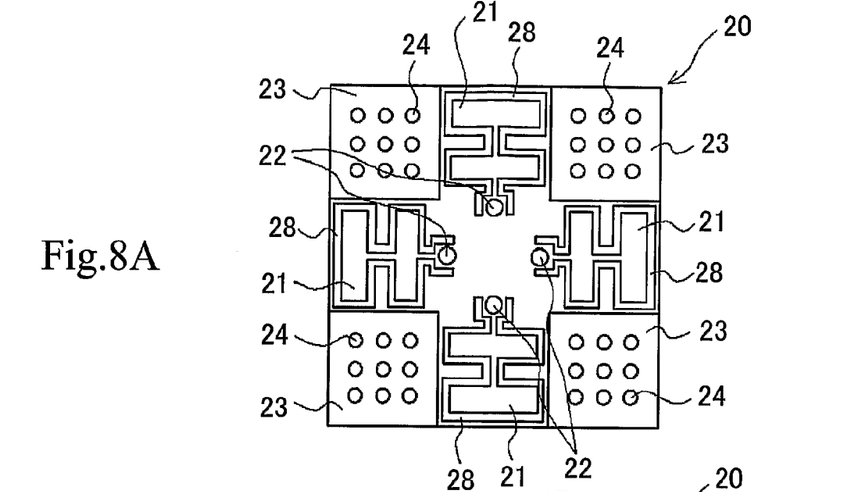
FIG. 8A to FIG. 8C are schematic plan views showing part of process steps of fabricating the optical information processing apparatus using the socket based on the present invention, according to the same.
Figure 8B:
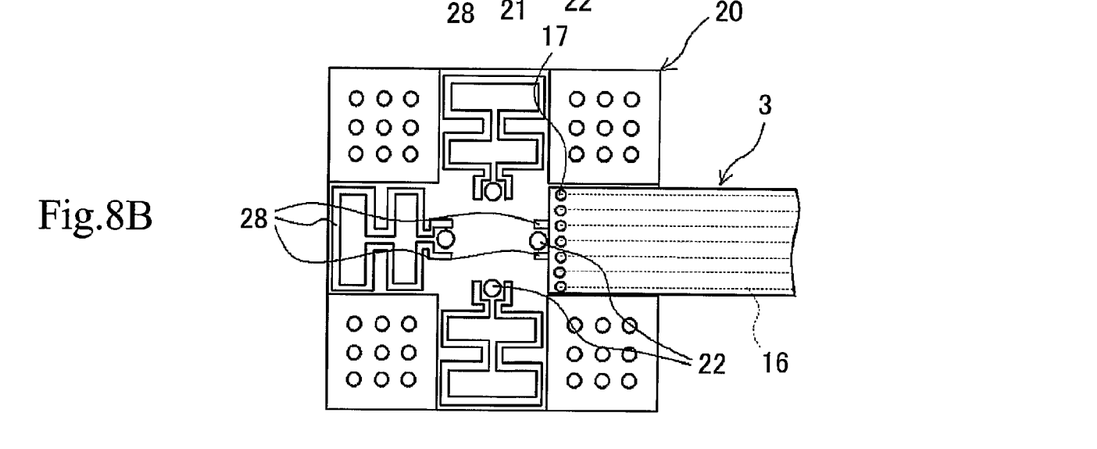
Figure 8C:
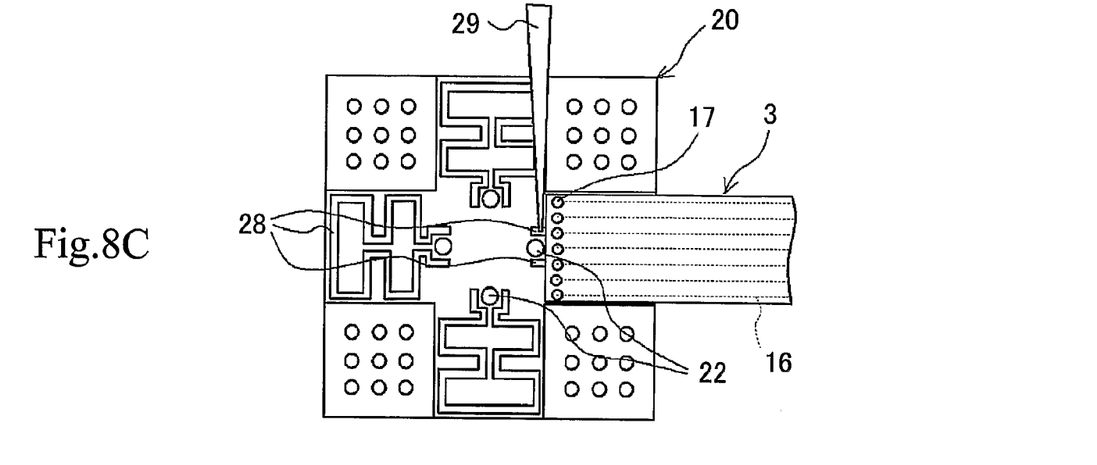

The optical waveguide 3 can be adhered and fixed to the sockets 20 by using an adhesive resin, although means therefore is not specifically limited. More specifically, first as shown in FIG. 8A, trenches 28 having an arbitrary geometry are formed on the bottom surface of the socket 20. The trenches 28 herein are formed so as to extend the end portion of each trench 28 to as far as the periphery of each projection 22. Next, as shown in FIG. 8B, the optical waveguide 3, having therein a plurality of core layers 16 arranged in parallel, is placed in the recesses 21 of the sockets 20. As described in the above, the optical waveguide 3 can readily be positioned in the longitudinal direction and in the width-wise direction thereof, by the projections 22 and the recesses 21 provided to the sockets 20. Because each trench 28 is formed so as to extend itself to as far as the periphery of each projection 22, a part of the trench 28 remains uncovered by the optical waveguide 3. Next, as shown in FIG. 8C, an adhesive resin is injected using a dispenser 29 or the like through a portion of the trench 28 not covered by the optical waveguide 3, and is allowed to solidify, thereby adhering and fixing the optical waveguide 3 to the recesses 21 of the sockets 20.

Figure 7D:
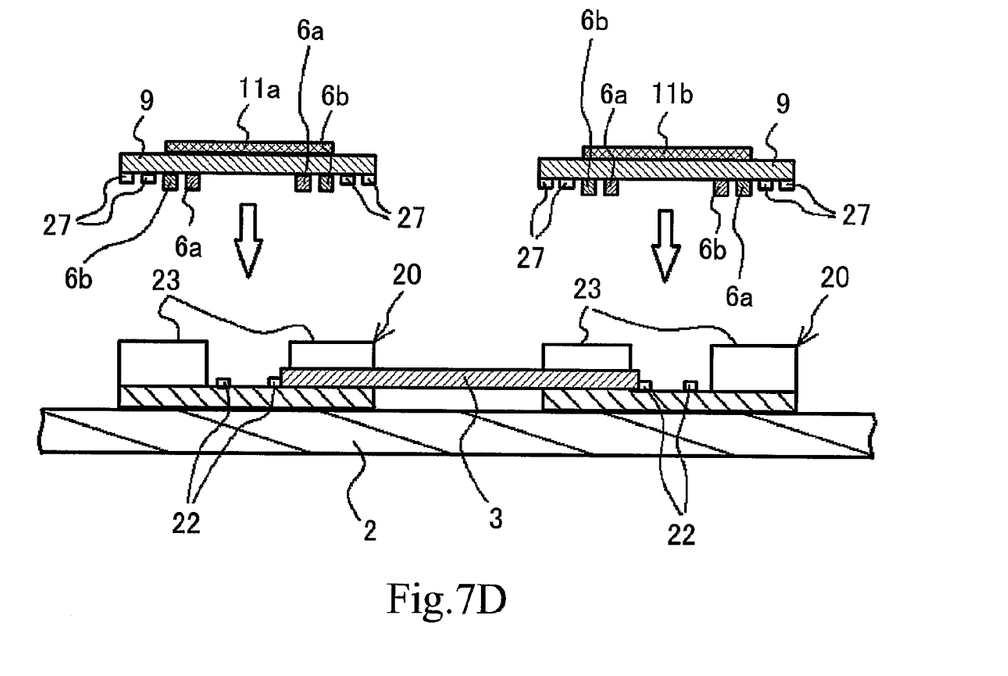

After the optical waveguide 3 is placed to the sockets 20 as described in the above, the interposer substrate 9 is fixed on the projection surfaces 23 of the sockets 20 as shown in FIG. 7D. The interposer substrate 9 herein has an MPU (micro processor unit) 11a or a DRAM (dynamic random access memory) 11b as the drive circuit element mounted on one surface side thereof, and has the photoelectric conversion element arrays 6a, 6b formed on the other surface side thereof. In this process, the side of surface of the interposer substrate 9, having the photoelectric conversion element arrays 6a, 6b mounted thereon, is configured so as to come into contact with the projection surfaces 23 of the sockets 20, and the fixation is accomplished so that the terminal pins (not shown) exposed to the projection surfaces 23 of the sockets 20 are electrically connected to the electrodes 27 for other signal interconnects on the interposer substrate 9.

Figure 7E:
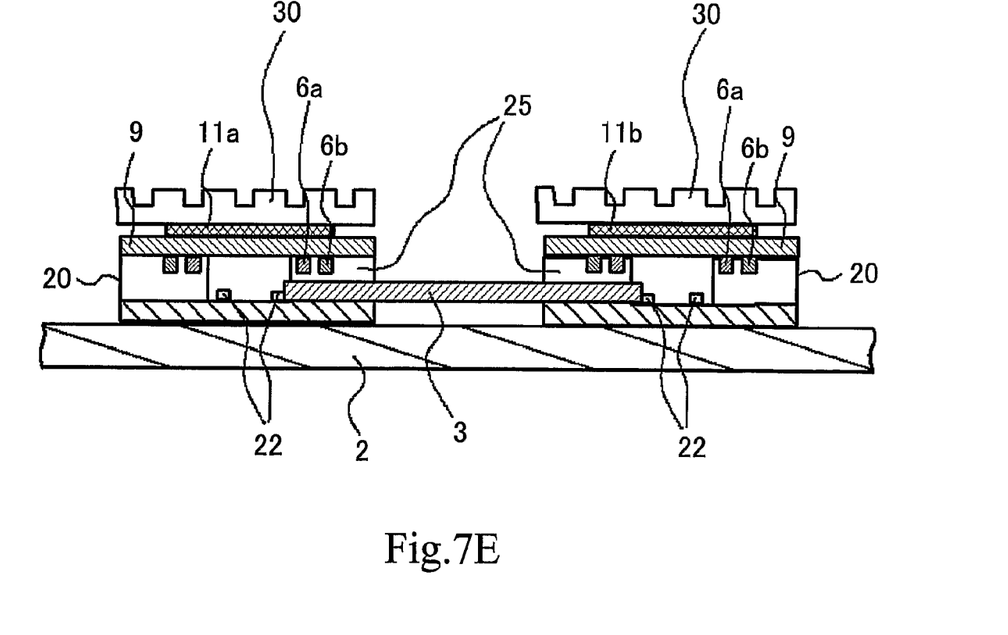

Next, as shown in FIG. 7E, an aluminum-made fin 30 is placed on each of the MPU 11a and the DRAM 11b.

As described in the above, an optical interconnect system, using the optical waveguide 3 as an optical interconnect, can be configured using the optical information processing apparatus 1 based on the present invention.

Figure 9A:
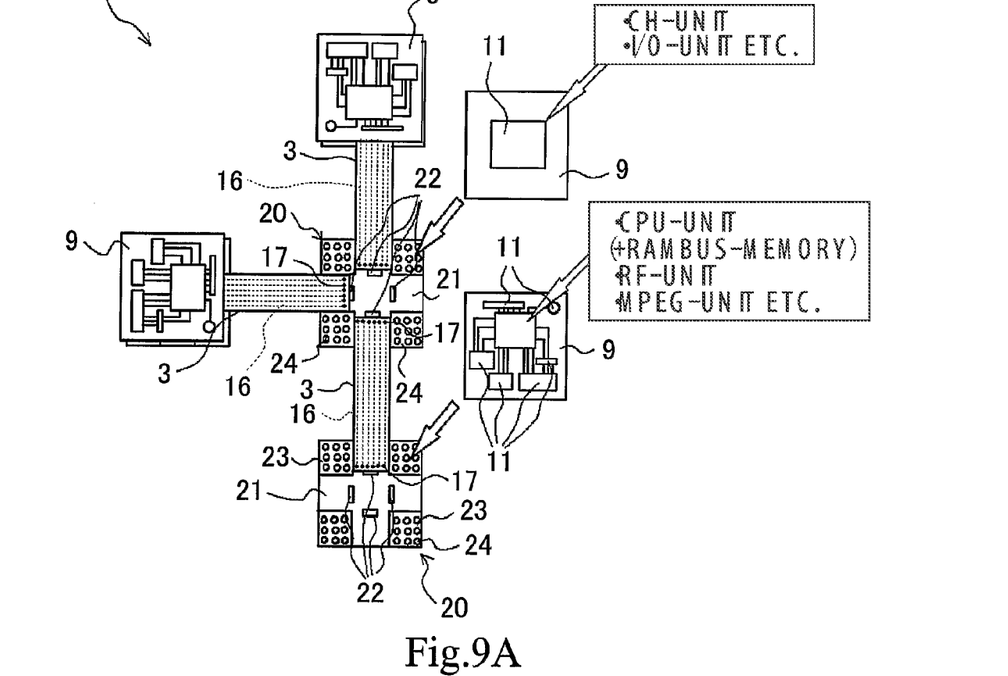
FIG. 9A and FIG. 9B are schematic drawings showing an exemplary optical information processing apparatus using the socket based on the present invention, according to the same.
Figure 9B:
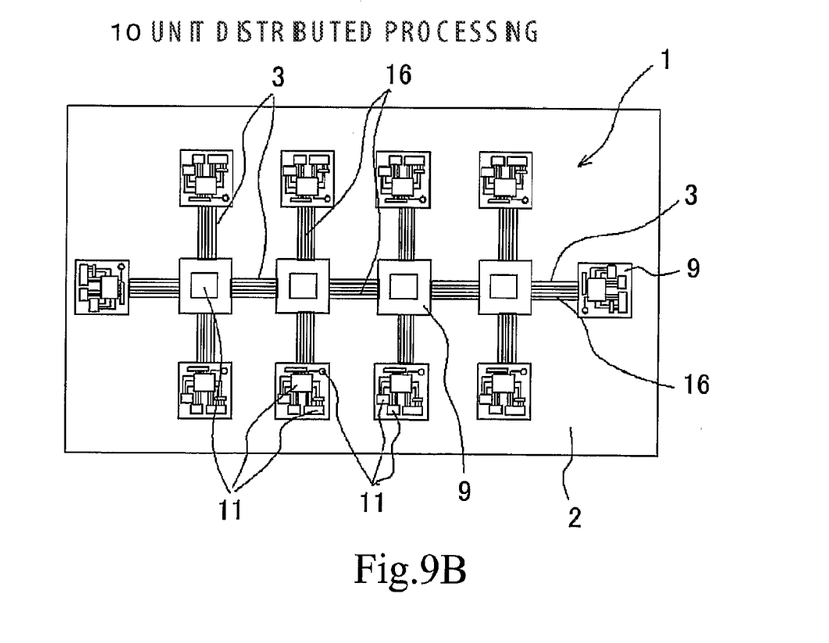

FIG. 9A and FIG. 9B are schematic drawings showing examples of the optical information processing apparatus 1 based on the present invention developed over the printed wiring board 2. For example, the apparatus can arbitrarily be developed into four directions, by normalizing the optical waveguide module.

According to this embodiment, the photoelectric conversion element array based on the present invention is composed of a plurality of photoelectric conversion elements arranged in an array, and the photoelectric conversion elements are arranged alternately at different positions so that every second one is aligned on the same line in the direction of array, so that a sufficient level of distance can be ensured between every adjacent photoelectric conversion elements even if the integration density of the core layers is increased. Difficulty in the mounting can therefore be moderated, and optical and electrical interferences and crosstalk of the photoelectric conversion elements are effectively avoidable, allowing further pursuit of larger transmission capacity and lower cost of the system.

Because the occupied area of the lens components can be increased, coupling efficiency can be improved, and consequently it is made possible to typically improve the system reliability, and to suppress the power consumption.

Moreover, the distance between the adjacent external connection terminals (and the adjacent solder bumps) can be increased, and thereby the reliability and mass producibility are improved.

Signal lines between the drive circuit elements 11a, 11b and the photoelectric conversion elements can be made short and equal in length. Therefore, countermeasures for noise in the electric signal and for crosstalk are simplified, and optical modulation speed can be improved.

The optical waveguide 3 can electrically be connected to the printed wiring board 2 as being placed in the recesses 21 of the sockets 20, so that currently available mounting structure on the printed wiring board 2 is directly applicable without modification. Any other general electric interconnects can be formed according to the conventional processes, if only an area allowing therein placement of the sockets 20 is provided on the printed wiring board 2.

The optical waveguide 3 can be placed in the recesses of the sockets 20, after the sockets 20 are fixed on the printed wiring board 2, and after completion of all mounting processes including high temperature processes such as solder re-flow, molding with an underfill resin and so forth, so that the optical waveguide 3 can be mounted without being damaged by high temperature, even if the optical waveguide 3 is susceptible to high-temperature processes.

The sockets 20 can be fabricated using a resin larger in rigidity than the printed wiring board 2, and the emitting optics or receiving optics and the optical waveguide 3 can optically be coupled on the socket 20, so that a level of accuracy required for the optical coupling can readily be ensured. For example, the currently available molding technique is enough to ensure an assembly accuracy of a several-micrometer level. It is therefore made possible to raise the density of an optical bus.

The optical waveguide 3 can electrically be connected to the printed wiring board 2, as being provided to the recesses 21 of the sockets 20, so that it is made possible to develop an optical interconnect system on the printed wiring board 2 at a low cost and with a large degree of freedom, while keeping a high density interconnects on the printed wiring board 2 and the degree of freedom in the design thereof unchanged, in prospects of high-speed decentralized processing on the printed wiring board, higher functionalization of electronic instruments on the total basis, and decrease in TAT (turn around time) of development.

By mounting the drive circuit elements 11a, 11b on the sockets 20 as being mediated by the interposer substrates 9, an by forming the gap 25 between one surface 26 side of the optical waveguide 3 and the interposer substrate 9, the optical waveguide 3 is effectively prevented from being destroyed by heat generated by the drive circuit elements 11a, 11b during use of the optical information processing apparatus 1.

The present invention has been explained referring to the embodiments, allowing various modifications of the above-described examples based on the technical spirit of the present invention.

For example, the present invention is preferably applicable to the above-described optical interconnect system carrying signals on laser beam, but is also applicable to displays or the like if a light source is appropriately selected.

INDUSTRIAL APPLICABILITY

The present invention is preferably applicable to an optical information processing apparatus such as an optical interconnect emitting signal light after being efficiently condensed by the optical waveguides to give a predetermined flux of light, or after being efficiently input to the optical waveguides, and then allowing the emitted signal light to enter the receiving optics (optical interconnects, photo-detectors, and so forth) of the circuits in the next stage.

The invention claimed is:

1. A photoelectric conversion element array integrated apparatus comprising:
   a plurality of photoelectric conversion element arrays having a plurality of photoelectric conversion elements arranged in an array having at least a first line and a second line, said photoelectric conversion elements arranged alternately at different positions so that a first photoelectric conversion element and every other photoelectric conversion element along the first line after the first photoelectric conversion element are aligned along the first line, and a second photoelectric conversion element and every other photoelectric conversion element along the second line after the second photoelectric conversion element are aligned along the second line; and
   an emitting optics array arranged on an interposer substrate so as to oppose said array, said emitting optics array and said array mounted on said interposer substrate through external connection terminals,
   wherein,
      adjacent ones of said photoelectric conversion element arrays have their individual photoelectric conversion elements disposed therein at different positions such that adjacent photoelectric conversion elements are separated from each other.

2. A photoelectric conversion element array comprising:
   a plurality of photoelectric conversion elements arranged in an array having at least a first line and a second line, said photoelectric conversion elements arranged alternately at different positions so that a first photoelectric conversion element and every other photoelectric conversion element along the first line after the first photoelectric conversion element are aligned along the first line, and a second photoelectric conversion element and every other photoelectric conversion element along the second line after the second photoelectric conversion element are aligned along the second line;
   a plurality of external connection terminals arranged in the array along said first line and said second line, each external connection terminal connected to one of said plurality of photoelectric conversion elements, each external connection terminal arranged alternately at different positions; and
   an emitting optics array arranged on an interposer substrate so as to oppose said array, said emitting optics array and said array mounted on said interposer substrate through said external connection terminals.

* * * * *